United States Patent
Stampalia

(10) Patent No.: US 9,819,315 B2
(45) Date of Patent: Nov. 14, 2017

(54) SCALEABLE RF TUNED LOW NOISE AMPLIFIER

(71) Applicant: Sunrise Micro Devices, Inc., Deerfield Beach, FL (US)

(72) Inventor: Anthony Kresimir Stampalia, Sunrise, FL (US)

(73) Assignee: SUNRISE MICRO DEVICES, INC., Deerfield Beach, FL (US)

( * ) Notice: Subject to any disclaimer, the term of this patent is extended or adjusted under 35 U.S.C. 154(b) by 0 days.

(21) Appl. No.: 14/945,785

(22) Filed: Nov. 19, 2015

(65) Prior Publication Data
US 2017/0005630 A1   Jan. 5, 2017

Related U.S. Application Data

(60) Provisional application No. 62/187,672, filed on Jul. 1, 2015.

(51) Int. Cl.
*H03F 3/45* (2006.01)
*H03F 1/56* (2006.01)
(Continued)

(52) U.S. Cl.
CPC ............ *H03F 1/565* (2013.01); *H03F 1/14* (2013.01); *H03F 3/193* (2013.01); *H03F 3/265* (2013.01);
(Continued)

(58) Field of Classification Search
CPC .......... H03F 3/45; H03F 1/14; H03F 2200/06; H03F 2200/09
(Continued)

(56) References Cited

U.S. PATENT DOCUMENTS

| 3,835,406 A | 9/1974 | Thompson |
| 6,518,841 B1 | 2/2003 | Mariani et al. |

(Continued)

FOREIGN PATENT DOCUMENTS

WO    WO 2004/086608    10/2004

OTHER PUBLICATIONS

Allstot et al., "Design considerations for CMOS low-noise amplifiers", 2004 IEEE Radio Frequency Integrated Circuits Symposium, Jun. 6-8, 2004, pp. 97-100.

*Primary Examiner* — Steven J Mottola
(74) *Attorney, Agent, or Firm* — Leveque IP Law, P.C.

(57) ABSTRACT

A power-efficient neutralized signal amplifier for use in ultra-low power narrowband receiver applications. A neutralized signal amplifier having: an impedance transformation element coupled to an amplifier input and having a differential output; a gain cell, having a differential input and a differential output, the differential input coupled to the differential output of the impedance transformation element and the differential output coupled to the amplifier output; and a neutralization element coupled to the gain cell differential output and cross-coupled to the differential output of the impedance transformation element, where the coupling of the neutralization element to the differential output of the impedance transformation element provides that the input impedance of the neutralized signal amplifier is substantially determined by reflected resistive parasitics of the impedance transformation element.

24 Claims, 4 Drawing Sheets

(51) Int. Cl.
*H03F 3/193* (2006.01)
*H03F 1/14* (2006.01)
*H03F 3/26* (2006.01)
*H03F 3/30* (2006.01)

(52) U.S. Cl.
CPC ....... *H03F 3/3064* (2013.01); *H03F 2200/06* (2013.01); *H03F 2200/294* (2013.01); *H03F 2200/451* (2013.01); *H03F 2200/534* (2013.01); *H03F 2200/546* (2013.01); *H03F 2203/30099* (2013.01); *H03F 2203/30132* (2013.01)

(58) Field of Classification Search
USPC .......................................... 330/253, 254, 301
See application file for complete search history.

(56) References Cited

U.S. PATENT DOCUMENTS

| | | | |
|---|---|---|---|
| 7,256,646 B2 * | 8/2007 | Eid | H03F 1/14 327/563 |
| 8,130,039 B2 * | 3/2012 | Dishop | H03F 3/211 330/276 |
| 2007/0046376 A1 * | 3/2007 | Van Der Heijden | H03F 1/083 330/292 |
| 2013/0234798 A1 | 9/2013 | Sato | |

* cited by examiner

SCALEABLE RF TUNED LOW NOISE AMPLIFIER

PRIORITY CLAIM

This application claims the benefit of Provisional Patent Application No. 62/187,672, filed Jul. 1, 2015, the contents of which are hereby incorporated by reference in their entirety.

BACKGROUND

General implementations of a receiver front end low noise amplifier (LNA) utilize either a common-gate (CG) stage or an inductively-degenerated common-source (CS) stage. The generic inductively-degenerated CS stage does utilize passive voltage gain through the resonance of the reactive components, but the circuit architecture cannot maximize the transconductance or $g_m$ through the use of complementary devices, and it cannot scale in power consumption as the input impedance matching condition would not be maintained. Alternatively, the CG architecture does not utilize passive voltage gain and it also cannot be scaled in power consumption without negative impact on the input impedance matching condition. Furthermore, the nature of the matched impedance of the CG stage limits the amount of selectivity that can be obtained through simple inductive-capacitive (LC) resonance (before the signal reaches the active devices of the CG stage) to a lower quantity than the inductively degenerated CS. In ultra-low power applications, selectivity is highly desirable as the power constraints generally make circuit tolerance to large signal conditions very poor.

BRIEF DESCRIPTION OF THE DRAWINGS

The accompanying drawings provide visual representations which will be used to more fully describe various representative embodiments and can be used by those skilled in the art to better understand the representative embodiments disclosed and their inherent advantages. In these drawings, like reference numerals identify corresponding elements.

DETAILED DESCRIPTION

Figure 1:
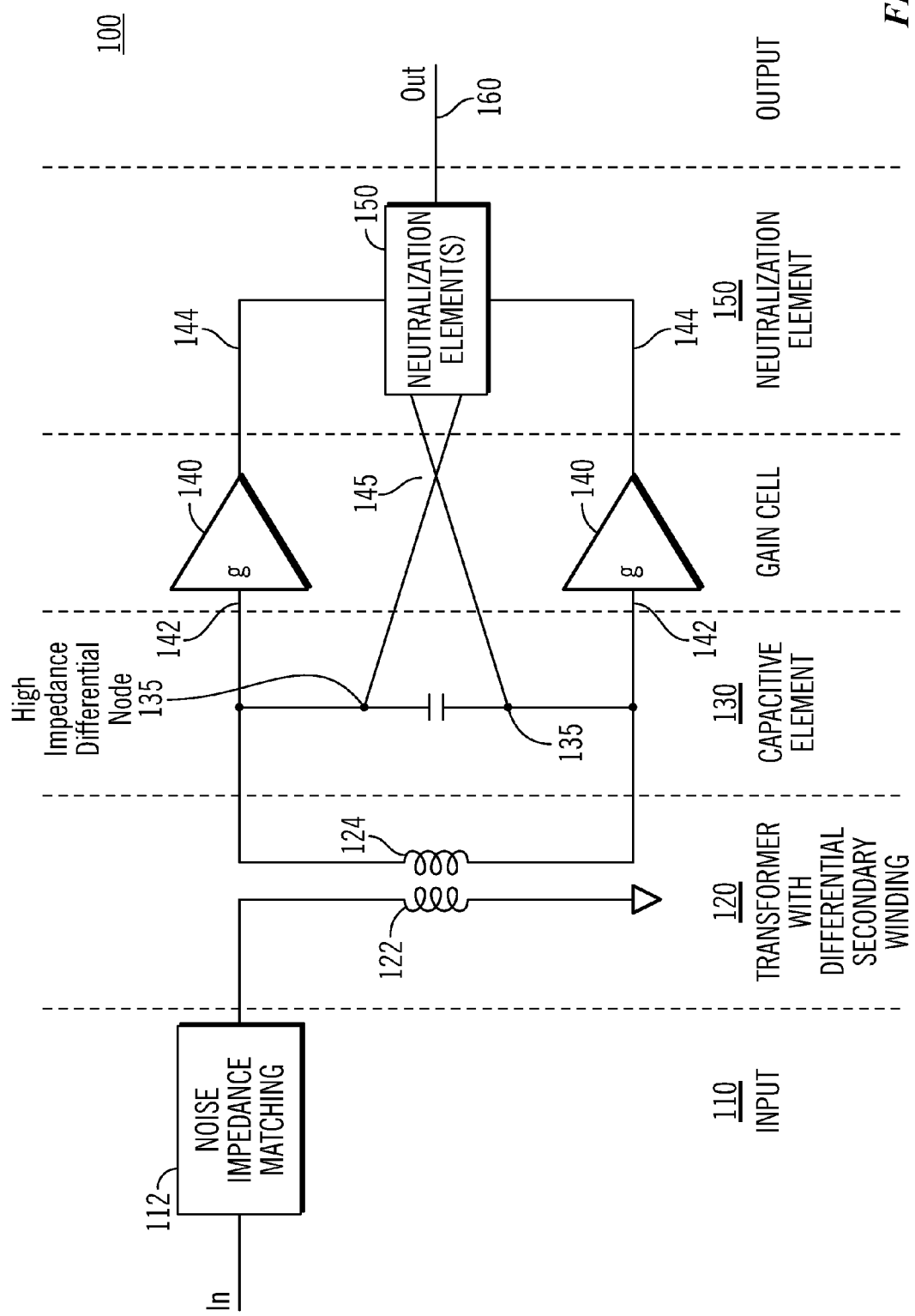
FIG. 1 illustrates a block diagram of a neutralized signal amplifier, in accordance with various representative embodiments.

The various apparatus and devices described herein provide a circuit design of a power-efficient neutralized signal amplifier for use in ultra-low power narrowband receiver applications.

In accordance with certain representative embodiments of the present disclosure, there is provided a neutralized signal amplifier having an input and an output, the amplifier having: an impedance transformation element coupled to the amplifier input and having a differential output; a gain cell, having a differential input and a differential output, the differential input coupled to the differential output of the impedance transformation element and the differential output coupled to the amplifier output; and a neutralization element coupled to the gain cell differential output and cross-coupled to the differential output of the impedance transformation element, where the coupling of the neutralization element to the differential output of the impedance transformation element provides that the input impedance of the neutralized signal amplifier is substantially determined by reflected resistive parasitics of the impedance transformation element.

In accordance with certain other representative embodiments of the present disclosure, there is provided a neutralized signal amplifier having an input and an output, the amplifier having: a transformer, having a primary winding and a differential secondary winding, the primary winding coupled to the amplifier input; a gain cell, having a differential input and a differential output, the differential input coupled to the transformer differential secondary winding and the differential output coupled to the amplifier output; a neutralization element coupled to the gain cell differential output and cross-coupled to the transformer differential secondary winding; and a capacitive element at the transformer differential secondary winding, where the coupling of the neutralization element and the capacitive element to the differential secondary winding provides that reflected resistive parasitics of the transformer substantially determine an input impedance of the neutralized signal amplifier.

Further, in accordance with certain representative embodiments of the present disclosure, there is provided a neutralized signal amplifier with an input and an output, the amplifier having: a transformer, having a primary winding and a differential secondary winding, the primary winding coupled to the amplifier input; a scaleable transconductance-gain cell, having a differential input and a differential output, the differential input coupled to the transformer differential secondary winding and the differential output coupled to the amplifier output; neutralization capacitors coupled to the gain cell differential output and cross-coupled to the transformer differential secondary winding; and a capacitive element coupled across the transformer differential secondary winding, where the coupling of the neutralization capacitors and the capacitive element to the differential secondary winding provides that reflected resistive parasitics of the transformer substantially determine an input impedance of the neutralized signal amplifier.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Reference throughout this document to "one embodiment", "certain embodiments", "an embodiment" or similar terms means that a particular feature, structure, or characteristic described in connection with the embodiment is included in at least one embodiment of the present invention. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

In ultra-low power narrowband receiver applications, where power consumption is a primary specification that supersedes absolute minimum noise performance, the disclosed embodiments have utility. The various representative embodiments disclosed herein maximize the efficiency, defined as gain for a given power consumption, and the selectivity of an RF amplifier front end gain cell or stage for a given power consumption. Additionally, scaling provides the benefit of further power reduction as the system requirement for noise performance (generally due to the automatic gain control (AGC) action of a receiver in the presence of sufficient signal strength conditions) is reduced. A gain cell has associated with it a relatively high input impedance, a gain, an efficiency, and a differential input and a differential output. As used herein, a gain cell could have multiple gain stages and a gain cell could be a transconductance-gain cell or a voltage-gain cell. Thus the disclosed embodiments define an implementation that can yield maximum power efficiency and maximum selectivity with power scalability. As will be described in connection with a transconductance-gain cell, due to transconductance scaling, maximum transconductance efficiency, i.e. transconductance-per-unit-current efficiency, and maximum selectivity of a transconductance-gain cell may be obtained as power consumption by the transconductance-gain cell is varied. As understood in the art, transconductance is denoted by the symbol $g_m$ while gain in a voltage-gain cell is denoted by the symbol $g_v$.

This concept is based on creating a high impedance node, which in effect maximizes impedance matched passive voltage gain and selectivity due to the LC resonance implemented at this node. A high impedance differential node is created by use of a high Q transformer to drive a neutralized differential gain cell or stage. The differential operation at the transformer differential secondary winding, combined by a cross-coupled replica feedback path, neutralizes the parasitic feedback path in active devices of the gain cell, thus creating a high impedance node at the interface of the transformer differential secondary winding and the active devices of the gain cell. Therefore, when resonated with a capacitive element at or of the transformer differential secondary winding, the impedance loading at the transformer differential secondary winding that is due to the active complementary gain stage is effectively removed. The capacitive element may be the inherent parasitic capacitance of the transformer differential secondary winding itself or the capacitive element may be a capacitor, variable or otherwise, across the transformer differential secondary winding, as shown in the figures.

Thus the impedance as seen at the transformer differential secondary winding is substantially defined by the equivalent parasitic shunt resistance of the secondary winding and the step-up turns ratio of the transformer, which is then essentially limited by the Q factor of the transformer in a given process technology. This equivalent parasitic shunt resistance of the transformer, as seen reflected back to the input, defines the match at the input of the amplifier network, as the use of neutralization and LC resonance at the secondary decouples the effect of the gain cell on the input impedance of the amplifier and may be referred to as the reflected resistive parasitics of the transformer. The equivalent parasitic shunt resistance of the combination of the transformer differential secondary winding resonated by the capacitive element has a value such that, when reduced by the square of the transformer turns ratio, it sets the resistive portion of the amplifier input impedance to a desired value. This is made possible by the neutralization, which ensures that the effective input impedance of the gain cell is at such a high value that it does not significantly load the equivalent parasitic shunt resistance of the transformer secondary winding. The input impedance of the amplifier is thus substantially independent of the input impedance of the gain cell or stage itself Because of this feature, the gain and power consumption of the gain cell can be varied over a wide range, while keeping the amplifier input match unchanged. Prudent selection of a transformer allows voltage gain for a desired input impedance of the amplifier to be controlled; selection of a transformer with the highest possible turns ratio, consistent with obtaining the desired input impedance of the amplifier, achieves maximum voltage gain. In the case where parasitic resistance is modeled with a resistor in series with an inductor rather than with a shunt resistor configuration, parasitic resistance may be described as equivalent parasitic series resistance.

Accordingly, the embodiments presented herein describe an amplifier, such as a receiver front end LNA or other receiver preamplifier, having an input impedance that is substantially independent of the input impedance of the gain cell (or gain stage) itself. Because of this feature, the gain and power consumption of the gain cell can be varied over a wide range, while keeping the input match of the amplifier unchanged. This feature can be useful for automatic gain control (AGC) and reduction of power consumption in sufficient signal strength conditions, for example.

With regard to process technologies that may be used in the disclosed embodiments, field-effect transistors (FETs) are useful given the relatively high input impedance needed for the gain cell described herein. In addition to complementary metal-oxide semiconductor (CMOS) technology, metal-semiconductor field-effect transistors (MESFETs), high-electron-mobility transistors (HEMTs), FETs on silicon-on-insulator (SOI) or other suitable semiconductor process technologies may be used. MESFETs and HEMTs, for example, may be implemented in gallium arsenide (GaAs) or other suitable compounds. And, because compound semiconductor and SOI devices form insulating substrates, input transformers formed from them will typically have a lower loss (higher Q) than equivalent transformers manufactured on bulk silicon.

Benefits of the embodiments disclosed herein therefore include at least the following:

The high impedance node can drive a complementary gain cell or gain stage, such as a complementary CS gain cell, with a voltage-amplified version of the input to maximize effective transconductance for the gain cell for a given power consumption, and reduce the effective noise contribution from the active devices of the gain cell.

The high impedance node allows a high Q tank at the differential secondary winding of the transformer to allow for maximum filtering selectivity with the use of a LC parallel resonance condition.

The high impedance node allows for scaling of gain cell transconductance for power consumption benefit, since impedance matching is already performed in the creation of the high impedance node and decoupled from active devices of the gain cell via neutralization.

Referring now to FIG. 1, a neutralized signal amplifier 100 having an input 110 and an output 160, in accordance with various embodiments, is shown. Transformer 120 has a primary winding 122 and a differential secondary winding 124, with the primary winding 122 coupled to the amplifier input 110. The primary winding may be single-ended or differential. Gain cell 140 is arranged in a differential arrangement with a differential input and a differential output, with differential input 142 coupled to the transformer differential secondary winding 124 and the differential output 144 coupled to the amplifier output 160. Also coupled to the gain cell differential output 144 and cross-coupled to the transformer differential secondary winding 124 is neutralization element 150. As will be seen in FIGS. 2-4, neutralization element 150 may be implemented using capacitors, inductors or transformers; there are many neutralization schemes that may be employed with the disclosed embodiments. A capacitive element 130 is coupled across the transformer differential secondary winding 124, operable to produce a high differential impedance at high impedance differential node 135 that is coupled to the transformer differential secondary winding 124 as shown. As noted previously, capacitive element 130 may be a capacitor separate from the transformer secondary winding 124 as shown; alternately, the parasitic capacitance of transformer differential secondary winding 124 can provide the functionality of capacitive element 130. Capacitive element 130 may be a single capacitor, a variable capacitor, a bank of switchable capacitors, or other elements that have a capacitance characteristic.

Figure 2:
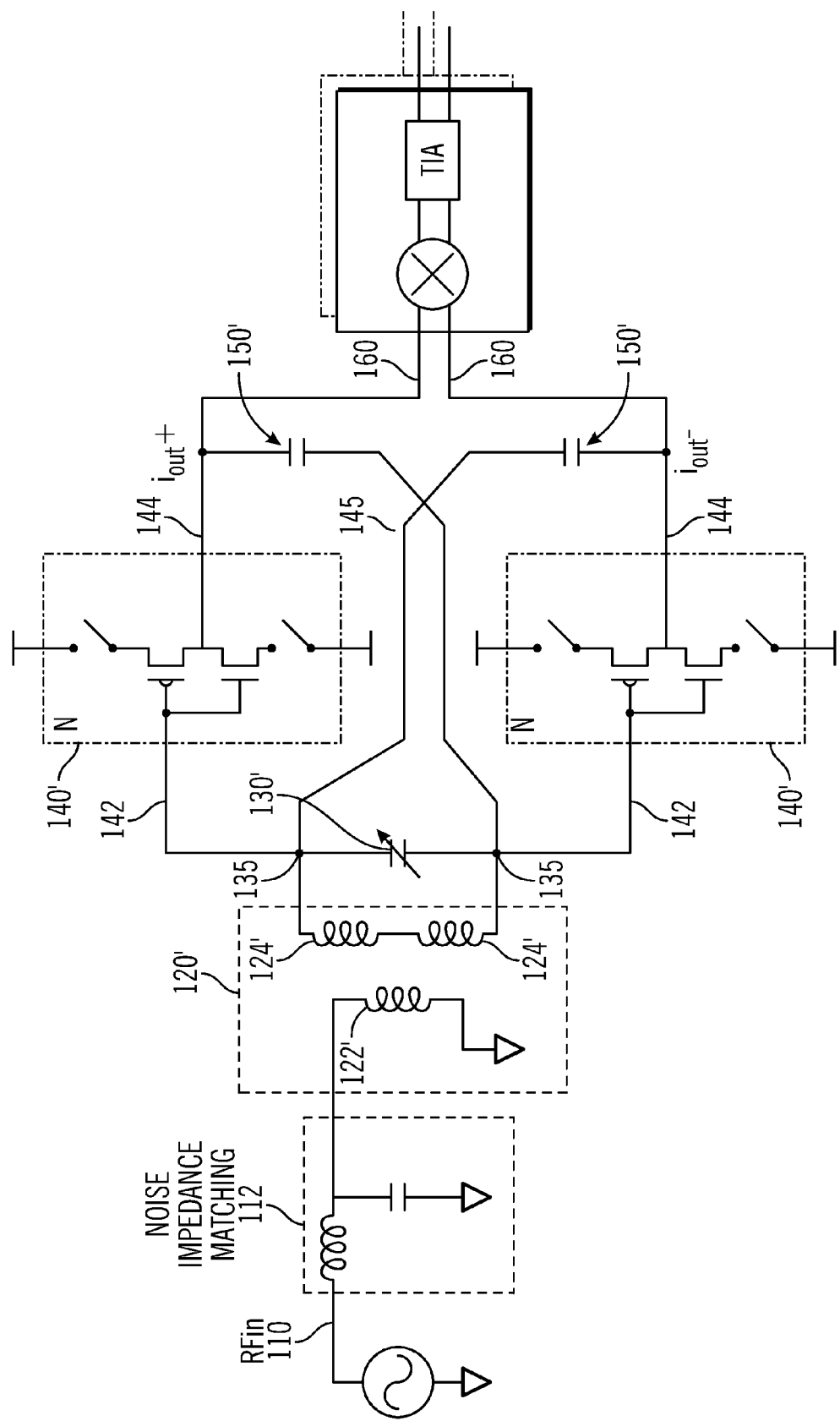
FIG. 2 illustrates a block diagram of a neutralized signal amplifier that employs a transconductance-gain cell, in accordance with various representative embodiments.

In accordance with an example implementation in which the gain cell is a transconductance-gain or "$g_m$" cell, as shown in the block diagram of a neutralized signal amplifier in FIG. 2, a high impedance differential node 135 with shunt LC resonance is created through a combination of LC impedance scaling provided by the step-up balun transformer 120'. Neutralization is implemented via the replica cross-coupled feedback path 145 coupled to the differential transconductance-gain cell 140', denoted with symbol $g_m$, as shown. The high impedance node 135 maximizes passive voltage gain and selectivity due to the LC resonance implemented at node 135 by the inductors of differential secondary winding 124' and capacitive element 130. A low impedance receiver chain may be coupled to the differential output 144 as shown.

As has been described, high impedance differential node 135 is created by step-up balun transformer 120', a high Q transformer, which drives neutralized differential transconductance-gain cell 140', a scaleable complementary transconductance gain cell. The differential operation at the transformer differential secondary winding 124', combined by a cross-coupled replica feedback path 145, neutralizes the parasitic feedback path in active devices of transconductance-gain cell 140', thus creating a high impedance node 135 at the interface of the transformer differential secondary winding 124' and the active devices of the transconductance-gain cell 140'. When resonated with the capacitor element 130' at the differential secondary winding 124', shown as a variable capacitive element in this embodiment, impedance loading at the balun transformer differential secondary winding 124' caused by the active complementary transconductance-gain cell is effectively removed. Thus the impedance at the differential secondary winding 124' is driven by the equivalent resistance of the secondary winding and the step-up turns ratio of the transformer 120', the impedance of which is then essentially limited by the Q factor of the transformer 124' in a given process technology. This equivalent parasitic shunt resistance of the transformer, as seen reflected back to the input, is the reflected resistive parasitics of the transformer in this embodiment and defines the match at the input 110 of the amplifier 100, as the use of neutralization and LC resonance at the differential secondary winding 124' decouples the effect of the transconductance-gain cell on the input impedance of the amplifier 100.

Impedance matching at the frequency of operation of the receiver is achieved through the appropriate design of the noise impedance matching element 112, shown in FIGS. 1 and 2, and step-up transformer 120' (Q and turns ratio) and programmable tank resonance at the differential secondary winding 124'. While noise impedance matching element 112 of FIG. 2 illustrates an inductor and capacitor in the arrangement shown, many different configurations of noise impedance matching are contemplated. This impedance matching (or impedance step-up) may be entirely achieved through specific design parameters of the balun transformer 120'. The explicit and additional impedance matching network 112, can be implementation specific and can perform a portion of the impedance transformation, but is not required to perform any portion of the impedance transformation described herein.

Figure 3:
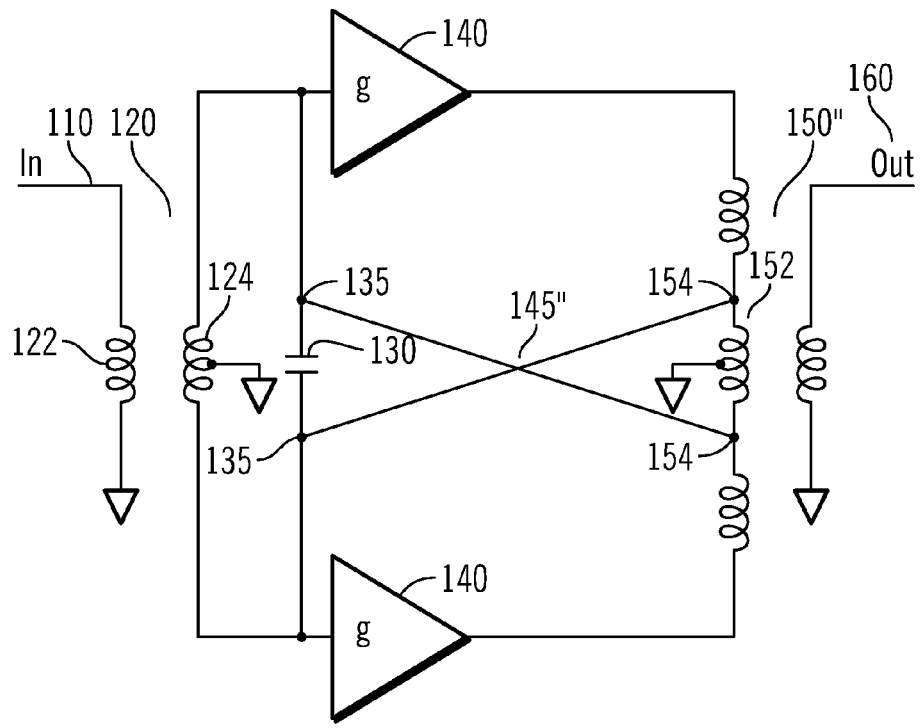
FIG. 3 illustrates a block diagram of a neutralized signal amplifier in which tapped-inductor neutralization is shown, in accordance with various representative embodiments.
Figure 4:
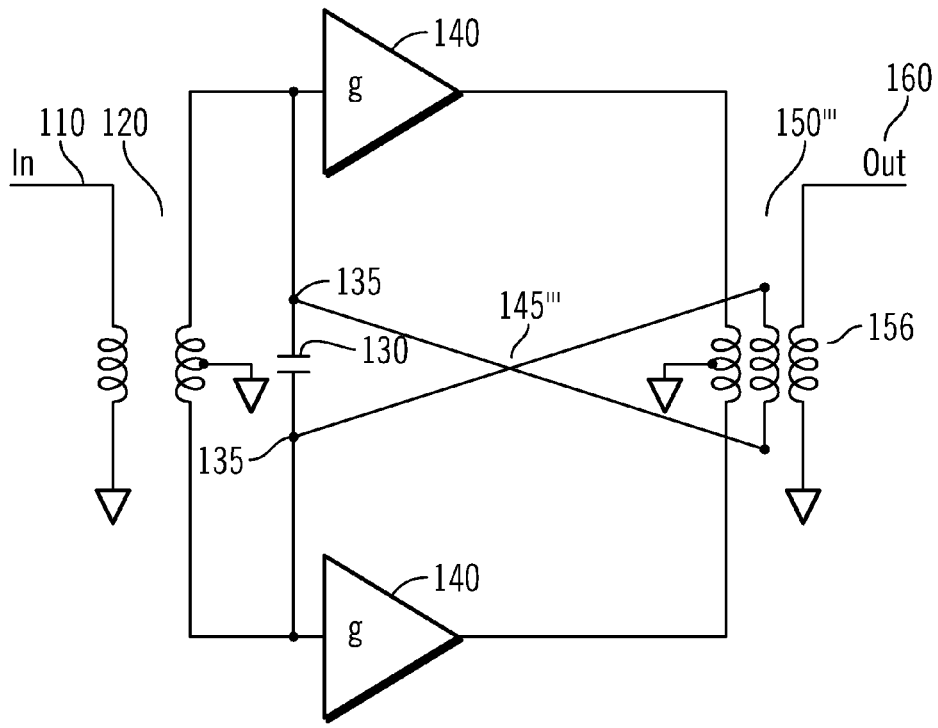
FIG. 4 illustrates a block diagram of a neutralized signal amplifier in which transformer neutralization is shown, in accordance with various representative embodiments.

As previously mentioned, there are various neutralization schemes that may be employed. As an alternative to the capacitive neutralization scheme provided by neutralization capacitors 150' coupled to the gain cell differential output 144 and cross-coupled to the transformer differential secondary winding 124' in FIG. 2, FIGS. 3 and 4 illustrate a tapped-inductor neutralization scheme and a transformer neutralization scheme, respectively. Referring now to FIG. 3, the center-tapped primary winding 152 of transformer neutralization element 150" has additional feedback taps 154 cross-coupled back to the differential secondary winding 124 of input transformer 120 in the cross-coupled feedback path 145", thereby providing tapped-inductor neutralization. In FIG. 4, an output transformer serves as the neutralization element 150''' in the neutralized signal amplifier. Trifilar-wound output transformer 150''' has a winding 156, which is also cross-coupled back to the differential secondary winding of the input transformer 120 in the cross-coupled feedback path 145′′′, providing transformer neutralization as shown.

Figure 5:
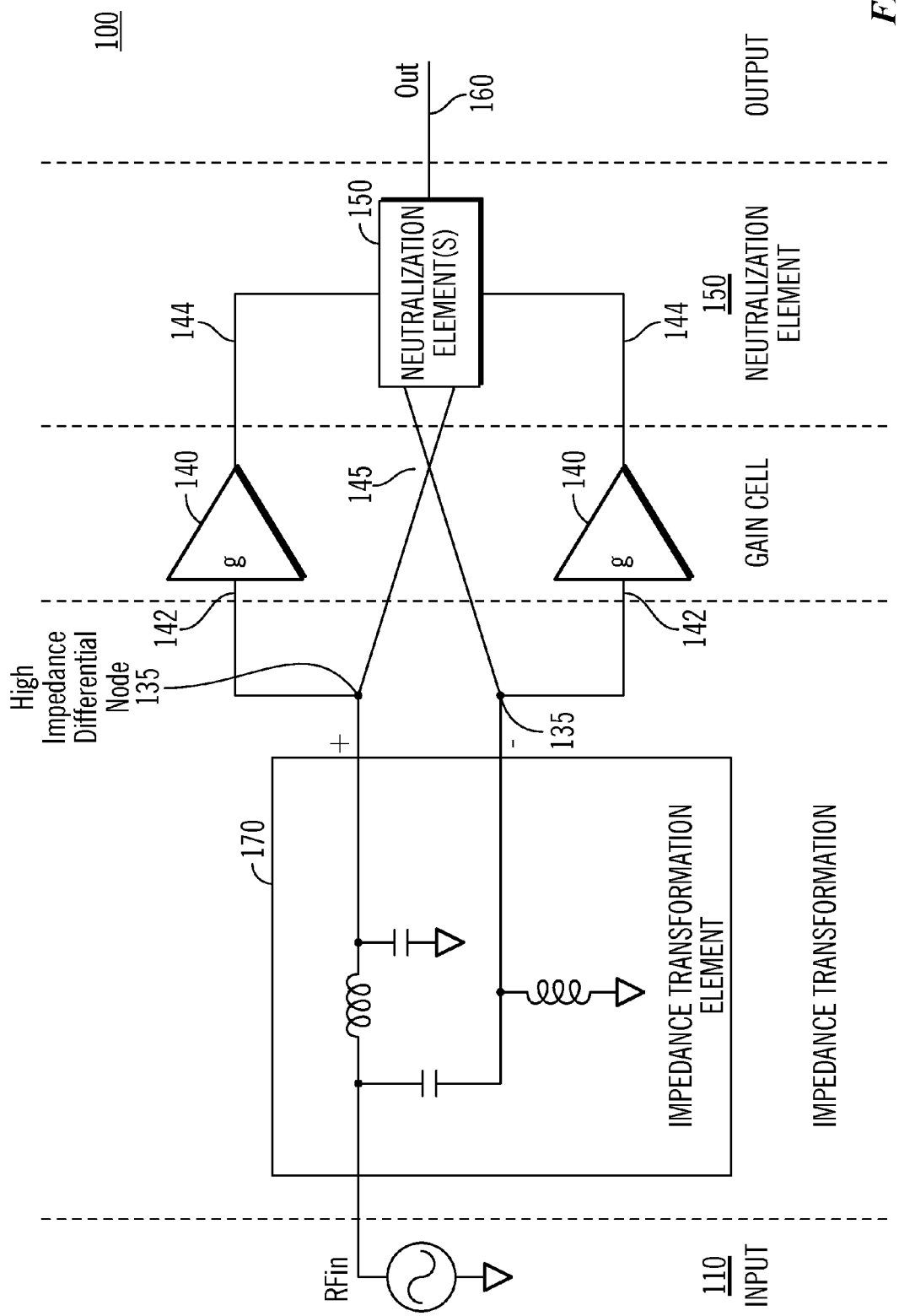
FIG. 5 illustrates a block diagram of a neutralized signal amplifier having an impedance transformation element, in accordance with various representative embodiments.

While various embodiments that employ discrete impedance matching, transformer, and capacitive elements are shown in FIGS. 1-4, these functionalities may optionally be replaced with an impedance transformation element coupled to the input of a neutralized signal amplifier, the input(s) of a gain cell, and cross-coupled to a neutralization element. Referring now to FIG. 5, a block diagram of such a neutralized signal amplifier having an impedance transformation element 170 is shown. The noise impedance matching element 112, the transformer with differential secondary winding 120 and the capacitive element 130 of FIG. 1, for example, may be replaced by impedance transformation element 170 of FIG. 5. Thus, for example, the explicit capacitor 130' of FIG. 2, for example, becomes embedded, together with noise impedance matching element 112 and balun transformer 120', in the impedance transforming network of impedance transformation element 170. In an embodiment in which the amplifier input is differential, a single IN pin at input 110 may be replaced with IN+ and IN− and the common node would be removed.

As long as impedance transformation element 170 operates to transform the input impedance of the amplifier input 110 to a high impedance at its output (high impedance differential node 135), the individual configuration of elements within impedance transformation element 170 can be as shown in FIG. 5 or be otherwise configured. In a particular implementation, the structure of impedance transformation element 170 is tuned in frequency with the appropriate choice of inductive and capacitive elements such that resonance is achieved at the desired frequency. Additionally, the capacitive and inductive elements may be selected such that the voltage gain is maximized and "balanced" on both differential outputs 135 while an input impedance matching condition is maintained through the reflection of the parasitic resistances of the matching elements of impedance transformation element 170, i.e. the reflected resistive parasitics of impedance transformation element 170, at the input of the amplifier. The LC resonance achievable at differential node 135 is somewhat compromised by this approach, however, making filtering less effective. Accordingly, some aspects and features of the disclosed embodiments are set out in the following numbered items:

1. A neutralized signal amplifier having an input and an output, comprising: a transformer, having a primary winding and a differential secondary winding, the primary winding coupled to the amplifier input;
a transconductance-gain cell, having a differential input and a differential output, the differential input coupled to the transformer differential secondary winding and the differential output coupled to the amplifier output;
neutralization capacitors coupled to the gain cell differential output and cross-coupled to the transformer differential secondary winding; and
a capacitive element coupled across the transformer differential secondary winding, where the coupling of the neutralization capacitors and the capacitive element to the differential secondary winding provides that reflected resistive parasitics of the transformer substantially determine an input impedance of the neutralized signal amplifier.
2. The neutralized signal amplifier of item 1, where the transformer primary winding is single-ended.
3. The neutralized signal amplifier of item 1, where the transformer is a balun transformer and the transformer differential secondary winding is a balun transformer differential secondary winding.
4. The neutralized signal amplifier of item 1, where the transformer primary winding is differential.
5. The neutralized signal amplifier of item 1, where an equivalent parasitic shunt resistance of the combination of the transformer differential secondary winding resonated by the capacitive element has a value such that, when reduced by the square of the transformer turns ratio of the transformer, the equivalent parasitic shunt resistance sets the resistive portion of the input impedance of the neutralized signal amplifier to a desired value.
6. The neutralized signal amplifier of item 1, where maximum transconductance efficiency and maximum frequency selectivity of the transconductance-gain cell are maintained as power consumption by the transconductance-gain cell is varied.
7. The neutralized signal amplifier of item 1, where the capacitive element is a variable capacitor.
8. The neutralized signal amplifier of item 1, wherein the neutralization capacitors are coupled to the gain cell differential output and cross-coupled to the transformer differential secondary winding and the capacitive element is coupled across the transformer differential secondary winding at a high impedance differential node.
9. A neutralized signal amplifier having an input and an output, comprising: a transformer, having a primary winding and a differential secondary winding, the primary winding coupled to the amplifier input;
a gain cell, having a differential input and a differential output, the differential input coupled to the transformer differential secondary winding and the differential output coupled to the amplifier output;
a neutralization element coupled to the gain cell differential output and cross-coupled to the transformer differential secondary winding; and
a capacitive element at the transformer differential secondary winding, where the coupling of the neutralization element and the capacitive element to the differential secondary winding provides that reflected resistive parasitics of the transformer substantially determine an input impedance of the neutralized signal amplifier.
10. The neutralized signal amplifier of item 9, where the transformer primary winding is single-ended.
11. The neutralized signal amplifier of item 9, where the transformer is a balun transformer and the transformer differential secondary winding is a balun transformer differential secondary winding.
12. The neutralized signal amplifier of item 8, where the transformer primary winding is differential.
13. The neutralized signal amplifier of item 9, where an equivalent parasitic shunt resistance of the combination of the transformer differential secondary winding resonated by the capacitive element has a value such that, when reduced by the square of the transformer turns ratio of the transformer, the equivalent parasitic shunt resistance sets the resistive portion of the input impedance of the neutralized signal amplifier to a desired value.
14. The neutralized signal amplifier of item 9, where maximum efficiency and maximum frequency selectivity of the gain cell are maintained as power consumption by the gain cell is varied.
15. The neutralized signal amplifier of item 9, where the gain cell is a transconductance-gain cell or a voltage-gain cell.

16. The neutralized signal amplifier of item 9, where the neutralization element comprises neutralization capacitors coupled to the gain cell differential output and cross-coupled to the transformer differential secondary winding.

17. The neutralized signal amplifier of item 9, where the neutralization element comprises an output transformer coupled to the gain cell differential output and where feedback taps of a center-tapped primary winding of the output transformer are cross-coupled to the transformer differential secondary winding.

18. The neutralized signal amplifier of item 9, where the neutralization element comprises an output transformer coupled to the gain cell differential output and where the output transformer is a trifilar-wound output transformer that is cross-coupled to the transformer differential secondary winding.

19. The neutralized signal amplifier of item 9, wherein the neutralization element is coupled to the gain cell differential output and cross-coupled to the transformer differential secondary winding and the capacitive element is coupled across the transformer differential secondary winding at a high impedance differential node.

20. The neutralized signal amplifier of item 9, where the capacitive element is one or more of the parasitic capacitance of the transformer differential secondary winding and a capacitor coupled across the transformer differential secondary winding.

21. A neutralized signal amplifier having an input and an output, with: an impedance transformation element coupled to the amplifier input and having a differential output;
a gain cell, having a differential input and a differential output, the differential input coupled to the differential output of the impedance transformation element and the differential output coupled to the amplifier output; and
a neutralization element coupled to the gain cell differential output and cross-coupled to the differential output of the impedance transformation element,
where the coupling of the neutralization element to the differential output of the impedance transformation element provides that the input impedance of the neutralized signal amplifier is substantially determined by the reflected resistive parasitics of the impedance transformation element.

The various representative embodiments, which have been described in detail herein, have been presented by way of example and not by way of limitation. It will be understood by those skilled in the art that various changes may be made in the form and details of the described embodiments resulting in equivalent embodiments that remain within the scope of the appended claims.

What is claimed is:

1. A neutralized signal amplifier having an input and an output, comprising:
    a transformer, having a primary winding and a differential secondary winding, the primary winding coupled to the amplifier input;
        a power scaleable transconductance-gain cell, having a differential input and a differential output, the differential input coupled to the transformer differential secondary winding and the differential output coupled to the amplifier output;
        neutralization capacitors coupled to the gain cell differential output and cross-coupled to the transformer differential secondary winding; and
        a capacitive element coupled across the transformer differential secondary winding, where the coupling of the neutralization capacitors and the capacitive element to the differential secondary winding creates a high impedance node at the transformer differential secondary winding and provides that reflected resistive parasitics of the transformer substantially determine an input impedance of the neutralized signal amplifier.

2. The neutralized signal amplifier of claim 1, where the transformer primary winding is single-ended.

3. The neutralized signal amplifier of claim 1, where the transformer is a balun transformer and the transformer differential secondary winding is a balun transformer differential secondary winding.

4. The neutralized signal amplifier of claim 1, where the transformer primary winding is differential.

5. A neutralized signal amplifier having an input and an output, comprising:
    a transformer, having a primary winding and a differential secondary winding, the primary winding coupled to the amplifier input;
    a scaleable transconductance-gain cell, having a differential input and a differential output, the differential input coupled to the transformer differential secondary winding and the differential output coupled to the amplifier output;
    neutralization capacitors coupled to the gain cell differential output and cross-coupled to the transformer differential secondary winding; and
    a capacitive element coupled across the transformer differential secondary winding, where the coupling of the neutralization capacitors and the capacitive element to the differential secondary winding provides that reflected resistive parasitics of the transformer substantially determine an input impedance of the neutralized signal amplifier,
    where an equivalent parasitic shunt resistance of the combination of the transformer differential secondary winding resonated by the capacitive element has a value such that, when reduced by the square of the transformer turns ratio of the transformer, the equivalent parasitic shunt resistance sets the resistive portion of the input impedance of the neutralized signal amplifier to a desired value.

6. A neutralized signal amplifier having an input and an output, comprising:
    a transformer, having a primary winding and a differential secondary winding, the primary winding coupled to the amplifier input
    a scaleable transconductance-gain cell, having a differential input and a differential output, the differential input coupled to the transformer differential secondary winding and the differential output coupled to the amplifier output;
    neutralization capacitors coupled to the gain cell differential output and cross-coupled to the transformer differential secondary winding; and
    a capacitive element coupled across the transformer differential secondary winding, where the coupling of the neutralization capacitors and the capacitive element to the differential secondary winding creates a high impedance node at the transformer differential secondary winding and provides that reflected resistive parasitics of the transformer substantially determine an input impedance of the neutralized signal amplifier,
    where maximum transconductance efficiency and maximum frequency selectivity of the transconductance-gain cell are maintained as power consumption by the transconductance-gain cell is varied.

7. The neutralized signal amplifier of claim 1, where the capacitive element is a variable capacitor.

8. The neutralized signal amplifier of claim 1, wherein the neutralization capacitors are coupled to the transconductance-gain cell differential output and cross-coupled to the transformer differential secondary winding and the capacitive element is coupled across the transformer differential secondary winding at the high impedance differential node.

9. A neutralized signal amplifier having an input and an output, comprising:
   a transformer, having a primary winding and a differential secondary winding, the primary winding coupled to the amplifier input;
   a scaleable gain cell, having a differential input and a differential output, the differential input coupled to the transformer differential secondary winding and the differential output coupled to the amplifier output, where maximum efficiency and maximum frequency selectivity of the gain cell are maintained as power consumption by the gain cell is varied;
   a neutralization element coupled to the gain cell differential output and cross-coupled to the transformer differential secondary winding; and
   a capacitive element at the transformer differential secondary winding, where the coupling of the neutralization element and the capacitive element to the differential secondary winding creates a high impedance node at the transformer differential secondary winding and provides that reflected resistive parasitics of the transformer substantially determine an input impedance of the neutralized signal amplifier.

10. The neutralized signal amplifier of claim 9, where the transformer primary winding is single-ended.

11. The neutralized signal amplifier of claim 9, where the transformer is a balun transformer and the transformer differential secondary winding is a balun transformer differential secondary winding.

12. The neutralized signal amplifier of claim 8, where the transformer primary winding is differential.

13. A neutralized signal amplifier having an input and an output, comprising:
   a transformer, having a primary winding and a differential secondary winding, the primary winding coupled to the amplifier input;
   a gain cell, having a differential input and a differential output, the differential input coupled to the transformer differential secondary winding and the differential output coupled to the amplifier output;
   a neutralization element coupled to the gain cell differential output and cross-coupled to the transformer differential secondary winding; and
   a capacitive element at the transformer differential secondary winding, where the coupling of the neutralization element and the capacitive element to the differential secondary winding provides that reflected resistive parasitics of the transformer substantially determine an input impedance of the neutralized signal amplifier, where an equivalent parasitic shunt resistance of the combination of the transformer differential secondary winding resonated by the capacitive element has a value such that, when reduced by the square of the transformer turns ratio of the transformer, the equivalent parasitic shunt resistance sets the resistive portion of the input impedance of the neutralized signal amplifier to a desired value.

14. The neutralized signal amplifier of claim 9, where the gain cell is a transconductance-gain cell or a voltage-gain cell.

15. The neutralized signal amplifier of claim 9, where the neutralization element comprises neutralization capacitors coupled to the gain cell differential output and cross-coupled to the transformer differential secondary winding.

16. A neutralized signal amplifier having an input and an output, comprising:
   a transformer, having a primary winding and a differential secondary winding, the primary winding coupled to the amplifier input;
   a gain cell, having a differential input and a differential output, the differential input coupled to the transformer differential secondary winding and the differential output coupled to the amplifier output;
   a neutralization element coupled to the gain cell differential output and cross-coupled to the transformer differential secondary winding; and
   a capacitive element at the transformer differential secondary winding, where the coupling of the neutralization element and the capacitive element to the differential secondary winding provides that reflected resistive parasitics of the transformer substantially determine an input impedance of the neutralized signal amplifier, where the neutralization element comprises an output transformer coupled to the gain cell differential output and where feedback taps of a center-tapped primary winding of the output transformer are cross-coupled to the transformer differential secondary winding.

17. The neutralized signal amplifier of claim 9, where the neutralization element comprises an output transformer coupled to the gain cell differential output and where the output transformer is a trifilar-wound output transformer that is cross-coupled to the transformer differential secondary winding.

18. The neutralized signal amplifier of claim 9, wherein the neutralization element is coupled to the gain cell differential output and cross-coupled to the transformer differential secondary winding and the capacitive element is coupled across the transformer differential secondary winding at the high impedance differential node.

19. The neutralized signal amplifier of claim 9, where the capacitive element is one or more of the parasitic capacitance of the transformer differential secondary winding and a capacitor coupled across the transformer differential secondary winding.

20. A neutralized signal amplifier having an input and an output, comprising:
   an impedance transformation element coupled to the amplifier input and having a differential output;
   a power scaleable gain cell, having a differential input and a differential output, the differential input coupled to the differential output of the impedance transformation element and the differential output coupled to the amplifier output; and
   a neutralization element coupled to the gain cell differential output and cross-coupled to the differential output of the impedance transformation element, where the coupling of the neutralization element to the differential output of the impedance transformation element creates a high impedance node at the differential output of the impedance transformation element and provides that the input impedance of the neutralized signal amplifier is substantially determined by reflected resistive parasitics of the impedance transformation element and where an equivalent parasitic shunt resistance of the combination of the impedance transformation element resonated by a portion of the neutralization element cross-coupled to the differential output of the impedance transformation element sets a resistive portion of an input impedance of the neutralized signal amplifier to a desired value.

21. A neutralized signal amplifier having an input and an output, comprising:

a transformer, having a primary winding and a differential secondary winding, the primary winding coupled to the amplifier input;

a scaleable complementary transconductance-gain cell, having a differential input and a differential output, the differential input coupled to the transformer differential secondary winding and the differential output coupled to the amplifier output;

neutralization capacitors coupled to the gain cell differential output and cross-coupled to the transformer differential secondary winding; and a capacitive element coupled across the transformer differential secondary winding, where the coupling of the neutralization capacitors and the capacitive element to the differential secondary winding creates a high impedance node at the transformer differential secondary winding and provides that reflected resistive parasitics of the transformer substantially determine an input impedance of the neutralized signal amplifier.

22. The neutralized signal amplifier of claim 21, where the scaleable complementary transconductance-gain cell is power scaleable.

23. A neutralized signal amplifier having an input and an output, comprising:

an impedance transformation element coupled to the amplifier input and having a differential output;

a scaleable complementary gain cell, having a differential input and a differential output, the differential input coupled to the differential output of the impedance transformation element and the differential output coupled to the amplifier output; and a neutralization element coupled to the gain cell differential output and cross-coupled to the differential output of the impedance transformation element, where the coupling of the neutralization element to the differential output of the impedance transformation element creates a high impedance node at the differential output of the impedance transformation element and provides that the input impedance of the neutralized signal amplifier is substantially determined by reflected resistive parasitics of the impedance transformation element and where an equivalent parasitic shunt resistance of the combination of the impedance transformation element resonated by a portion of the neutralization element cross-coupled to the differential output of the impedance transformation element sets a resistive portion of an input impedance of the neutralized signal amplifier to a desired value.

24. The neutralized signal amplifier of claim 23, where the scaleable complementary gain cell is power scaleable.

* * * * *